(12) United States Patent
Ono et al.

(10) Patent No.: US 8,304,924 B2
(45) Date of Patent: Nov. 6, 2012

(54) COMPOSITION FOR SEALING SEMICONDUCTOR, SEMICONDUCTOR DEVICE, AND PROCESS FOR PRODUCING SEMICONDUCTOR DEVICE

(75) Inventors: Shoko Ono, Ichihara (JP); Kazuo Kohmura, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 14 days.

(21) Appl. No.: 13/131,895

(22) PCT Filed: May 28, 2010

(86) PCT No.: PCT/JP2010/059151
§ 371 (c)(1),
(2), (4) Date: May 31, 2011

(87) PCT Pub. No.: WO2010/137711
PCT Pub. Date: Dec. 2, 2010

(65) Prior Publication Data
US 2011/0241210 A1 Oct. 6, 2011

(30) Foreign Application Priority Data
May 29, 2009 (JP) ................................. 2009-130251

(51) Int. Cl.
*H01L 23/29* (2006.01)
*H01L 23/48* (2006.01)

(52) U.S. Cl. ........ 257/793; 257/751; 257/762; 257/791; 257/792; 257/E23.136; 438/653; 438/675; 438/700; 438/780; 428/1.53

(58) Field of Classification Search .......... 257/787–789, 257/791–793, E23.136, E21.24, 750, 751, 257/758, 762; 438/780, 643, 653, 672, 675; 428/1.53
See application file for complete search history.

(56) References Cited

U.S. PATENT DOCUMENTS

| | | | |
|---|---|---|---|
| 5,786,025 A | 7/1998 | Saitou et al. | |
| 6,730,942 B2* | 5/2004 | Mabuchi et al. | 257/100 |
| 6,953,827 B2* | 10/2005 | Hara et al. | 525/58 |
| 2005/0025690 A1 | 2/2005 | Fukuda et al. | |
| 2006/0006541 A1 | 1/2006 | Tsuchiya et al. | |
| 2006/0166384 A1 | 7/2006 | Tatsumi | |
| 2007/0054135 A1 | 3/2007 | Morita et al. | |
| 2008/0311752 A1 | 12/2008 | Sharma | |
| 2009/0014846 A1 | 1/2009 | Fresco et al. | |
| 2010/0029057 A1* | 2/2010 | Iwasawa et al. | 438/400 |

FOREIGN PATENT DOCUMENTS

| | | | |
|---|---|---|---|
| JP | 9-40891 | * | 2/1995 |
| JP | 9-71461 A | | 3/1997 |
| JP | 2005-89240 A | | 4/2005 |
| JP | 2006-93657 A | | 4/2006 |
| JP | 2006-196796 A | | 7/2006 |
| JP | 2006-352042 A | | 12/2006 |
| JP | 2007-92019 A | | 4/2007 |
| JP | 2007-161784 A | | 6/2007 |
| JP | 2008-94993 A | | 4/2008 |
| JP | 2009-503879 A | | 1/2009 |
| JP | 2009-88247 A | | 4/2009 |
| JP | 2009-96863 A | | 5/2009 |
| WO | WO 2009/012184 A1 | | 1/2009 |
| WO | WO 2009/034596 A1 | | 3/2009 |

OTHER PUBLICATIONS

English translations of the Written Opinion of the International Search Authority (Form PCT/ISA/237) dated Jun. 29, 2010 and International Preliminary Report on Patentability (Form PCT/IB/373) dated Dec. 12, 2011 in corresponding International Patent Application No. PCT/JP2010/059151.

International Search Report (PCT/ISA/210) issued on Jun. 29, 2010, by Japanese Patent Office as the International Searching Authority for International Application No. PCT/JP2010/059151.

Written Opinion (PCT/ISA/237) issued on Jun. 29, 2010, by Japanese Patent Office as the International Searching Authority for International Application No. PCT/JP2010/059151.

* cited by examiner

*Primary Examiner* — Jasmine Clark
(74) *Attorney, Agent, or Firm* — Buchanan Ingersoll & Rooney PC

(57) ABSTRACT

The invention provides a composition for sealing a semiconductor, the composition being able to form a thin resin layer, suppress the diffusion of a metal component to a porous interlayer dielectric layer, and exhibit superior adherence with respect to an interconnection material. The composition for sealing a semiconductor contains a resin having two or more cationic functional groups and a weight-average molecular weight of from 2,000 to 100,000; contains sodium and potassium each in an amount based on element content of not more than 10 ppb by weight; and has a volume average particle diameter, measured by a dynamic light scattering method, of not more than 10 nm.

9 Claims, No Drawings

COMPOSITION FOR SEALING SEMICONDUCTOR, SEMICONDUCTOR DEVICE, AND PROCESS FOR PRODUCING SEMICONDUCTOR DEVICE

TECHNICAL FIELD

The present invention relates to a composition for sealing a semiconductor, a semiconductor device, and a process for producing a semiconductor device.

BACKGROUND ART

In the field of semiconductor devices, in which miniaturization has been advancing, various materials having a porous structure and a low dielectric constant (hereinafter, also referred to as "low-k materials") have been studied as a material for an interlayer dielectric layer for a semiconductor.

In a porous interlayer dielectric layer for a semiconductor such as this, there has been a problem in that when the porosity is increased to further lower the dielectric constant, it becomes easier for a metal component, such as copper that is embedded as an interconnection material, to intrude into pores of the interlayer dielectric layer for a semiconductor, thereby increasing the dielectric constant or causing leak currents.

In contrast, Japanese National Phase Publication No. 2009-503879 discloses a technique of sealing pores formed on side wall surfaces of grooves formed by etching, by using a micellar surfactant for wet washing after the etching, in a process for producing a semiconductor device in which a porous low dielectric constant material is used.

Further, for example, International Publication (WO) No. 09/012184 discloses a technique of controlling the hydrophilicity/hydrophobicity of a low-k material having a hydrophobic surface by applying a polyvinyl alcohol-based amphiphilic polymer to the surface of the material.

Further, for example, Japanese Patent Application Laid-Open (JP-A) No. 2006-352042 discloses a composition for polishing a semiconductor, the composition containing a cationic polymer and a surfactant.

DISCLOSURE OF THE INVENTION

Problems to be Solved by the Invention

However, according to the technique described in the Japanese National Phase Publication No. 2009-503879, a surfactant not having a micellar structure may intrude into pores on the side wall surfaces of grooves to increase the relative dielectric constant, or adherence between an interlayer dielectric layer and an interconnection material may decrease due to the micelles.

Further, according to the technique described in the International Publication (WO) No. 09/012184, a bulky layer is easily formed due to hydrogen bonds between the polyvinyl alcohol-based amphiphilic polymers, whereby the relative dielectric constant may increase or the adherence between an interlayer dielectric layer and an interconnection material may decrease.

An object of the present invention is to provide: a composition for sealing a semiconductor, the composition being able to form a thin resin layer, suppress the diffusion of a metal component to a porous interlayer dielectric layer, and exhibit superior adherence with respect to an interconnection material; a semiconductor device using the same; and a method of producing the semiconductor device.

Means for Solving the Problems

The present inventors have made intensive studies and, as a result, discovered that the object can be attained by a composition for sealing a semiconductor containing a specific resin, thereby completing the present invention.

Specifically, a first aspect of the present invention is a composition for sealing a semiconductor, the composition including a resin having two or more cationic functional groups and a weight-average molecular weight of from 2,000 to 100,000; sodium and potassium each in an amount based on element content of not more than 10 ppb by weight; and having a volume average particle diameter measured by a dynamic light scattering method of not more than 10 nm.

The resin preferably has a cationic functional group equivalent weight of from 43 to 430.

Further, the cationic functional group is preferably at least one selected from a primary amino group and a secondary amino group, and more preferably the resin is polyethyleneimine or a derivative of polyethyleneimine.

A second aspect of the present invention is a process for producing a semiconductor device, the method including a step for applying a sealing composition, in which step the composition for sealing a semiconductor is made to contact an interlayer dielectric layer formed on a substrate.

The interlayer dielectric layer preferably includes porous silica and has, on the surface thereof, residual silanol derived from the porous silica.

More preferably, the process further includes a step for forming a recessed groove having a width of from 10 nm to 32 nm in the interlayer dielectric layer, and the step for applying a sealing composition is a step of applying a composition for sealing a semiconductor onto an interlayer dielectric layer formed at the side surfaces of the recessed groove.

A third aspect of the present invention is a semiconductor device including a porous interlayer dielectric layer, a resin layer and a layer composed of copper in this order, the resin layer having a thickness of from 0.3 nm to 5 nm and including a resin having a cationic functional group and a weight-average molecular weight of from 2,000 to 100,000. More preferably, a copper barrier layer is provided between the resin layer and the layer of copper.

EFFECT OF THE INVENTION

According to the present invention, it is possible to provide a composition for sealing a semiconductor, the composition being able to form a thin resin layer, suppress the diffusion of a metal component to a porous interlayer dielectric layer, and exhibit superior adherence with respect to an interconnection material; a semiconductor device using the composition; and a method of producing the semiconductor device.

BEST MODE FOR CARRYING OUT THE INVENTION (Composition for Sealing Semiconductor)

The composition for sealing a semiconductor according to the present invention is used, for example, to form a resin layer that covers pores formed in a porous interlayer dielectric layer. The composition includes at least one type of resin having two or more cationic functional groups and a weight-average molecular weight of from 2,000 to 100,000, and includes sodium and potassium each in an amount based on element content of not more than 10 ppb. The volume average particle diameter of the composition measured by a dynamic light scattering method is not more than 10 nm.

When a composition for sealing a semiconductor having the above constitution is applied to an interlayer dielectric layer having a porous structure, pores existing on the surface of the interlayer dielectric layer are covered with a resin layer by way of, for example, multiple-point adsorption of the two or more cationic functional groups to the interlayer dielectric layer. As a result, diffusion of a metal component to the porous interlayer dielectric layer can be suppressed. Furthermore, since the resin layer formed from the resin has a small thickness (e.g., 5 nm or less), the adherence between the interlayer dielectric layer and an interconnection material formed on the interlayer dielectric layer via the resin layer is excellent, whereby changes in the relative dielectric constant can be suppressed.

(Resin)

The composition for sealing a semiconductor according to the present invention includes at least one type of resin having two or more cationic functional groups and a weight-average molecular weight of from 2,000 to 100,000.

The resin includes two or more of at least one type of cationic functional group, and may further include an anionic functional group or a nonionic functional group, as necessary. Furthermore, the resin may include a repeating unit structure having a cationic functional group, or may have a random structure formed by polymerization of a monomer that constitutes the resin in a branched manner, without a specific repeating unit structure. According to the present invention, from a standpoint of suppressing the diffusion of a metal component, the resin preferably has a random structure formed by polymerization of a monomer that constitutes the resin in a branched manner, without a specific repeating unit structure.

The cationic functional group is not particularly limited as long as it is a functional group that can be positively charged. Examples of the cationic functional group include an amino group and a quaternary ammonium group. Among them, from a standpoint of suppressing the diffusion of a metal component, the cationic functional group is preferably at least one of a primary amino group or a secondary amino group.

Further, the nonionic functional group may be either a hydrogen bond receptor group or a hydrogen bond donor group. Examples of the nonionic functional group include a hydroxyl group, a carbonyl group, and an ether bond.

Further, the anionic functional group is not particularly limited as long as it is a functional group that can be negatively charged. Examples of the anionic functional group include a carboxylic acid group, a sulfonic acid group, and a sulfuric acid group.

Although the resin may be any resin as long as it has two or more cationic functional groups in a molecule, a polymer having a high cation density is preferred from a standpoint of suppressing the diffusion of a metal component. To be more specific, the cationic functional group equivalent weight of the resin is preferably from 43 to 430, and more preferably from 200 to 400.

Further, since the density of polar groups at a surface of a porous interlayer dielectric layer decreases when the surface is subjected to hydrophobization by a known process, such as a process described in WO 04/026765 or WO 06/025501, the cationic functional group equivalent weight being in a range of from 200 to 400 is also preferable.

The cationic functional group equivalent weight refers to a weight-average molecular weight per cationic functional group, which is a value (Mw/n) obtained by dividing the weight-average molecular weight (Mw) of a resin by the number (n) of cationic functional groups contained in the resin corresponding to one molecule. The larger the cationic functional equivalent weight is, the lower the density of the cationic functional group is. On the other hand, the smaller the cationic functional group equivalent weight is, the higher the density of the cationic functional group is.

When the resin according to the present invention has a repeating unit structure including a cationic functional group (hereinafter, also referred to as a "specific unit structure"), the cationic functional group may exist at any portion of the specific unit structure, such as at least a portion of the main chain or at least a portion of the side chain, or both of the at least a portion of the main chain and the at least a portion of the side-chain.

Further, when the specific unit structure has two or more cationic functional groups, the two or more cationic functional groups may be the same or different from each other.

The cationic functional groups are preferably included such that the ratio of the main chain length of a specific unit structure to the average distance between the adsorption points (e.g. residual silanol) of the cationic functional groups existing on a porous interlayer dielectric layer (hereinafter, also referred to as a "relative distance between cationic functional groups") is from 0.08 to 1.2, more preferably from 0.08 to 0.6. The embodiment of such a kind makes it more efficient to achieve multiple-point adsorption of the resin to a porous interlayer dielectric layer.

In the present invention, from a standpoint of adsorbability with respect to an interlayer dielectric layer, the molecular weight of the specific unit structure is preferably from 30 to 500, and more preferably from 40 to 200. The molecular weight of the specific unit structure refers to a molecular weight of a monomer that constitutes the specific unit structure.

In the present invention, from a standpoint of adsorbability with respect to an interlayer dielectric layer, the specific unit structure preferably has a relative distance between the cationic functional groups of from 0.08 to 1.2 and a molecular weight of from 30 to 500; and more preferably a relative distance between the cationic functional groups of from 0.08 to 0.6 and a molecular weight of from 40 to 200.

Specific examples of the specific unit structure containing a cationic functional group according to the present invention include a unit structure derived from ethyleneimine, a unit structure derived from allylamine, a unit structure derived from a diallyldimethylammonium salt, a unit structure derived from vinylpyridine, a unit structure derived from lysine, a unit structure derived from methylvinylpyridine, and a unit structure derived from p-vinylpyridine. Among them, from a standpoint of adsorbability with respect to an interlayer dielectric layer, at least one of a unit structure derived from ethyleneimine or a unit structure derived from allylamine is preferable.

Further, the resin may include at least one of a unit structure containing a nonionic functional group and a unit structure containing an anionic functional group.

Specific examples of the unit structure containing a nonionic functional group include a unit structure derived from vinyl alcohol, a unit structure derived from alkylene oxide, and a unit structure derived from vinylpyrrolidone.

Further, specific examples of the unit structure containing an anionic functional group include a unit structure derived from styrenesulfonic acid, a unit structure derived from vinylsulfuric acid, a unit structure derived from acrylic acid, a unit structure derived from methacrylic acid, a unit structure derived from maleic acid, and a unit structure derived from fumaric acid.

In the present invention, when the resin includes two or more specific unit structures, the respective specific unit structures may be different from each other in any of the type or the number of the polar group included therein, the molecular weight, or the like. The two or more specific unit structures may be included in the resin as a block copolymer or a random copolymer.

The resin may further include at least one type of repeating unit structure other than the specific unit structure (hereinafter, also referred to as a "second unit structure"). When the resin contains a second unit structure, the specific unit structure and the second unit structure may be included in the resin as a block copolymer or a random copolymer.

The second unit structure is not particularly limited as long as it is a unit structure derived from a monomer capable of polymerizing with a monomer that constitutes the specific unit structure. One example of the second unit structure is a unit structure derived from an olefin.

When the resin according to the present invention has a random structure formed by polymerization of a monomer that constitutes the resin in a branched manner without having a specific repeating unit structure, the cationic functional group may exist at any portion of the resin such as at least a portion of the main chain or at least a portion of the side-chain, or both of the at least a portion of the main chain and the at least a portion of the side-chain.

Examples of the monomer that constitutes the resin include ethyleneimine and a derivative thereof.

Specific examples of the resin containing a cationic functional group according to the present invention include polyethyleneimine (PEI), polyallylamine (PAA), polydiallyldimethylammonium (PDDA), polyvinylpyridine (PVP), polylysine, polymethylpyridylvinyl (PMPyV), protonated poly(p-pyridyl vinylene) (R-PHPyV), and derivatives of these resins. Among them, polyethyleneimine (PEI) or a derivative thereof, polyallylamine (PAA) and the like are preferable, and polyethyleneimine (PEI) or a derivative thereof is more preferred.

In general, polyethyleneimine (PEI) can be produced by polymerizing ethyleneimine by an ordinary process. The polymerization catalyst and the polymerization conditions may be appropriately selected from those ordinarily used for polymerizing ethyleneimine. More specifically, the reaction may be caused, for example, at from 0 to 200° C. in the presence of an effective amount of acid catalyst, such as hydrochloric acid. Further, ethyleneimine may be subjected to addition polymerization based on polyethyleneimine. Polyethyleneimine according to the present invention may be a homopolymer of ethyleneimine, or a copolymer of ethyleneimine and a compound capable of copolymerizing with ethyleneimine, such as an amine. The process for producing polyethyleneimine is described in, for example, Japanese Patent Publication No. 43-8828 and Japanese Patent Publication No. 49-33120.

It is also possible to produce polyethyleneimine according to the present invention from crude ethyleneimine obtained from monoethanolamine. Details thereof can be found in Japanese Patent Application Laid-Open No. 2001-2123958.

The thus produced polyethyleneimine has a complicated structure including not only a partial structure in which ring-opened ethyleneimine are linked to each other in the form of a straight chain, but also a partial structure in which ethyleneimine are linked to each other in the form of a branched structure or a partial structure in which the straight-chain partial structures are linked to each other via cross-linking. Use of a resin containing cationic functional groups having a structure of such a kind makes the multiple-point adsorption of the resin more efficient. Further, interaction between the resins makes the formation of a coating layer more effective.

A polyethyleneimine derivative is also preferable as the resin according to the present invention. The polyethyleneimine derivative is not particularly limited as long as it is a compound that can be produced from polyethyleneimine. Specific examples thereof include a polyethyleneimine derivative prepared by introducing an alkyl group (preferably having 1 to 10 carbon atoms) or an aryl group into polyethyleneimine, and a polyethyleneimine derivative prepared by introducing a cross-linkable group such as a hydroxyl group into polyethyleneimine.

A polyethyleneimine derivative can be produced by an ordinary method in which polyethyleneimine is used. Specifically, for example, a polyethyleneimine derivative can be produced by a process described in Japanese Patent Application Laid-Open No. 6-016809.

In the present invention, polyethyleneimine and a derivative thereof may be a commercial product. For example, polyethyleneimine and a derivative thereof available from Nippon Shokubai Co., Ltd. or BASF SE may be appropriately selected and used.

The weight-average molecular weight of the resin according to the present invention is from 2,000 to 100,000, preferably from 10,000 to 80,000 and more preferably from 20,000 to 60,000.

For example, in case of using a composition for sealing a semiconductor according to the present invention for producing a semiconductor device having a distance between the adjacent interconnections of 32 nm or less and a pore diameter on an interlayer dielectric layer of approximately 2 nm, if the weight-average molecular weight of the resin is greater than 100,000, the size of the resin may be greater than the distance between the adjacent interconnections and the resin may not enter recessed grooves for embedding an interconnection material therein, whereby pores on side surfaces of the grooves may not be sufficiently covered. Meanwhile, if the weight-average molecular weight of the resin is below 2,000, the size of the molecule of the resin may be smaller than the diameter of pores on an interlayer dielectric layer and the resin molecule may enter the pores on the interlayer dielectric layer, thereby increasing the dielectric constant of the interlayer dielectric layer. Further, the resin may not adsorb at multiple points.

The weight-average molecular weight can be measured by a GPC apparatus ordinarily used for the measurement of the molecular weight of a resin.

It is also preferable that the resin has a critical micelle concentration in an aqueous medium of 1% by weight or higher, or the resin does not substantially form a micellar structure. The term "does not substantially form a micellar structure" refers to that the resin does not form micelles under normal conditions, such as in an aqueous medium at room temperature, i.e., it is not possible to measure the critical micelle concentration. When the resin has such characteristics, a thin resin layer having a thickness of molecule level (e.g. 5 nm or less) can be formed, and increase in the dielectric constant of an interlayer dielectric layer can be effectively suppressed. Further, adherence between the interlayer dielectric layer and an interconnection material can be effectively improved.

Further, the resin according to the present invention is preferably polyethyleneimine having a weight-average molecular weight of from 2,000 to 100,000 and a cationic functional group equivalent weight of from 43 to 430, and more preferably polyethyleneimine having a weight-average molecular weight of from 10,000 to 80,000 and a cationic functional group equivalent weight of from 200 to 400. When the resin is this embodiment, diffusion of a metal component to an interlayer dielectric layer may be suppressed more effectively, and adherence of an interlayer dielectric layer with respect to an interconnection material may be further improved.

The content of the resin in the composition for sealing a semiconductor according to the present invention is not particularly limited, and for example, the content of the resin may be from 0.01 to 1.0% by weight, preferably from 0.02 to 0.3% by weight. The content of the resin in the composition for sealing a semiconductor according to the present invention may be adjusted according to the area and the pore density of a surface on which a resin layer is to be formed from the composition.

(Other Components)

The contents of sodium and potassium in the composition for sealing a semiconductor according to the present invention are 10 ppb by weight or less, respectively, based on element content. In case the contents of sodium and potassium exceed 10 ppb by weight based on element content, leak current may occur.

As necessary, the composition for sealing a semiconductor according to the present invention may include a solvent, in addition to the resin. There is no particular restriction on the solvent used in the present invention, insofar as the solvent homogeneously dissolves the resin and hardly forms micelles. Examples of the solvent include water (preferably ultrapure water), and a water-soluble organic solvent, such as an alcohol. In the present invention, from a standpoint of an ability of forming micelles, water or a mixture of water and a water-soluble organic solvent is preferably be used as a solvent.

Further, although there is no particular restriction on the boiling point of the solvent, it is preferably 210° C. or less, and more preferably 160° C. or less. When the boiling point of the solvent is within this range, if, for example, a washing step or a drying step is provided after a step of contacting a composition for sealing a semiconductor with an interlayer dielectric layer according to the present invention, which will be described later, the solvent can be removed at low temperature under which the insulation property of the interlayer dielectric layer is not significantly impaired and delamination of the composition for sealing from the interlayer dielectric layer can he avoided.

As necessary, the composition for sealing a semiconductor according to the present invention may contain a cation such as a cesium ion, to such an extent that the advantages of the present invention are not compromised. By containing a cation of cesium or the like, the resin in the composition for sealing a semiconductor can spread more uniformly over an interlayer dielectric layer.

Further, the composition for sealing a semiconductor according to the present invention preferably does not contain a compound that causes corrosion or dissolution of the interlayer dielectric layer. More specifically, for example, if the main component of especially an interlayer dielectric layer is an inorganic compound such as silica, inclusion of a fluorine compound or the like in the composition according to the present invention may cause dissolution of the interlayer dielectric layer to damage the insulation property, thereby increasing the relative dielectric constant.

The composition for sealing a semiconductor according to the present invention preferably contains only compounds having a boiling point of 210° C. or less, preferably 160° C. or less, or only compounds that do not decompose when heated up to 250° C.

The term "compounds that do not decompose when heated up to 250° C." refers to compounds whose change in weight after being maintained at 250° C. under a nitrogen atmosphere for 1 hour, with respect to the weight measured at 25° C., is less than 50%.

The volume average particle diameter measured by a dynamic light scattering method of the composition for sealing a semiconductor according to the present invention is 10 nm or less. In case the volume average particle diameter exceeds 10 nm, adherence with respect to an interconnection material may decrease or diffusion of a metal component to an interlayer dielectric layer may not be sufficiently suppressed.

The volume average particle diameter used in the present invention is measured by a dynamic light scattering method (a method in which temporal fluctuations of scattering light measured by a dynamic light scattering method are analyzed by a photon correlation method under the conditions of, for example, the number of accumulation of 70 and the number of repetition of 1) at 23-26° C. using ELSZ-2 (manufactured by Otsuka Electronics Co., Ltd.).

The term "the volume average particle diameter exceeds 10 nm" in the present invention specifically refers to a case in which micelles (having an average particle diameter of 10 nm or larger) are formed in the composition, or a case in which polishing grains of a metal oxide or the like are contained in the composition, which polishing grains are used for polishing copper that forms interconnections (chemical mechanical polishing).

In case micelles having a large diameter are formed in the composition for sealing a semiconductor, for example, when the composition for sealing a semiconductor according to the present invention is used for producing a semiconductor device in which the distance between the adjacent interconnections is 32 nm or less, the resin in the composition for sealing a semiconductor may not sufficiently enter the recessed grooves for embedding an interconnection material therein, and pores at the side surfaces of the grooves may not be sufficiently covered.

There is no particular restriction on the pH of the composition for sealing a semiconductor according to the present invention. However, from a standpoint of adsorbability of the resin with respect to an interlayer dielectric layer, the pH is preferably not lower than the isoelectric point of the interlayer dielectric layer. Further, in case the resin contains a cationic functional group as a polar group, the pH of the composition for sealing a semiconductor is preferably in a pH range in which the cationic functional group is in a state of a cation. When the pH of the composition for sealing a semiconductor is within this range, adsorption of the resin to the interlayer dielectric layer may become more efficient due to a static interaction between the interlayer dielectric layer and the resin.

The isoelectric point of the interlayer dielectric layer refers to an isoelectric point of a compound that constitutes the interlayer dielectric layer. For example, if the compound that constitutes the interlayer dielectric layer is porous silica, the isoelectric point is around pH 2 (25° C.).

The pH range in which the cationic functional group is in a state of a cation refers to that the pH of the composition for sealing a semiconductor is not higher than the $pK_b$ of the resin containing cationic functional groups. For example, in case the resin containing cationic functional groups is polyallylamine, the $pK_b$ is from 8 to 9, and in case it is polyethyleneimine, the $pK_b$ is from 7 to 11.

In other words, according to the present invention, the pH of the composition for sealing a semiconductor may be selected as appropriate according to the type of the compound that constitutes an interlayer dielectric layer and the type of the resin. For example, the pH is preferably from 2 to 11, more preferably from 7 to 11.

The pH (25° C.) is measured with a pH meter for ordinary use.

Process for Producing Semiconductor Device

The process for producing a semiconductor device according to the present invention is a process for producing a semiconductor device having an interlayer dielectric layer on a substrate, the process including a step for applying a sealing composition in which the composition for sealing a semiconductor is made to contact the interlayer dielectric layer, and other steps as necessary.

The interlayer dielectric layer used in the present invention it not particularly limited as long as it is formed of a low dielectric constant material and has a porous structure. However, the interlayer dielectric layer preferably contains porous silica and has residual silanol derived from the porous silica on the surface thereof. By the interaction of the residual silanol with the cationic functional groups contained in the resin, a thin layer of the resin is formed in such a manner that pores on the interlayer dielectric layer are covered by the resin.

(Porous Silica)

In the present invention, any kind of porous silica commonly used for an interlayer dielectric layer of a semiconductor device may be used without particular restriction. Examples of the porous silica include an oxide having uniform mesopores produced by utilizing self-organization of an inorganic compound and an organic compound synthesized hydrothermally using a silica gel and a surfactant in a hermetically-closed heat resistant container, as described in WO 91/11390; and porous silica produced from a condensate of an alkoxysilane and a surfactant, as described in Nature, 1996, vol. 379 (p. 703) or Supramolecular Science, 1998, vol. 5, (p. 247, etc.).

Among them, porous silica prepared from a composition for preparing porous silica, which composition contains a specific siloxane compound described hereinbelow, is preferably used.

Composition for Preparing Porous Silica

The composition for preparing porous silica that may be used in the present invention includes (A) a hydrolysis product of an alkoxysilane compound, (B) a hydrolysis product of a siloxane compound expressed by the following formula (1), (C) a surfactant, and (D) an element having an electronegativity of 2.5 or less.

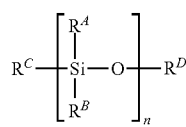
(1)

In the formula (1), each of $R^A$ and $R^B$ independently represents a hydrogen atom, a phenyl group, a —$C_aH_{2a+1}$ group, a —$(CH_2)_b(CF_2)_cCF_3$ group, or a —$C_dI_{2d-1}$ group, but $R^A$ and $R^B$ are not simultaneously hydrogen atoms;

$R^C$ and $R^D$ represent a single bond that links a silicon atom and an oxygen atom to form a cyclic siloxane structure, or each of $R^C$ and $R^D$ independently represents a hydrogen atom, a phenyl group, a —$C_aH_{2a+1}$ group, a —$(CH_2)_b(CF_2)_cCF_3$ group, or a —$C_dH_{2d-1}$ group; and a is an integer from 1 to 6, b is an integer from 0 to 4, c is an integer from 0 to 10, d is an integer from 2 to 4, and n is an integer of 3 or greater.

By using a composition for preparing porous silica of the above embodiment, porous silica having both a low dielectric constant and a high mechanical strength can be prepared.

The composition for preparing porous silica used in the present invention may further include a solvent such as water or an organic solvent, a catalyst, or the like, as necessary.

The composition used in the present invention contains, as component (A), a hydrolysis product of an alkoxysilane compound (except an alkoxysilane compound described as a siloxane compound expressed by the formula (1)). A hydrolysis product is obtained from the alkoxysilane compound (component (A)) by hydrolysis (and polycondensation).

The hydrolysis product is a component that constitutes a main skeletal structure of a porous material to be obtained, and preferably a dense inorganic polymer.

The alkoxysilane compound forms an inorganic polymer by polycondensation at a site of a silanol group formed by hydrolysis of an alkoxy group (an alkoxy group bonded to a silicon atom). Therefore, the alkoxysilane compound preferably includes two or more alkoxy groups in a molecule in order to obtain component (A) as a dense inorganic polymer. In this case, two or more alkoxy groups may be bonded to one silicon atom. Further, the alkoxysilane compound may be a compound including two or more units in which one silicon atom is bonded to one alkoxy group.

The alkoxysilane compound as mentioned above is preferably at least one selected from the group consisting of a compound expressed by the following formula (i), a compound expressed by the following formula (ii) and a compound expressed by the following formula (iii).

(i)

In the formula, $R^1$ may be the same or different from each other, and each represents a —$C_aH_{2a+1}$ group or a phenyl group; and a is an integer of from 1 to 6.

(ii)

In the formula, $R^2$ represents a —$C_aH_{2a+1}$ group, a phenyl group, a —$(CH_2)_c(CF_2)_bCF_3$ group, a hydrogen atom or a fluorine atom. In case x is 2 or less, the two or more of $R^3$ may be the same or different from each other, and each represents a —$C_aH_{2a+1}$ group or a phenyl group; x is an integer from 0 to 3; a is an integer from 1 to 6; b is an integer from 0 to 10; and c is an integer from 0 to 4;

(iii)

In the formula, y and z may be the same or different from each other, and are integers from 0 to 2; $R^4$ and $R^7$ may be the same or different from each other, and represent a —$C_aH_{2a+1}$ group, a phenyl group, a —$(CH_2)_c(CF_2)_bCF_3$ group, a hydrogen atom or a fluorine atom; $R^5$ and $R^6$ may be the same or different from each other, and represent a —$C_aH_{2a+1}$ group or a phenyl group; a is an integer from 1 to 6; b is an integer from 0 to 10; c is an integer from 0 to 4; A is an oxygen atom, a —$(CH_2)_d$-group or a phenylene group; and d is an integer from 1 to 6.

Specific examples of an alkoxysilane compound in the present invention include a quaternary alkoxysilane, such as tetramethoxysilane, tetraethoxysilane, tetraisopropoxysilane, and tetrabutoxysilane; a tertiary alkoxyfluorosilane, such as trimethoxyfluorosilane, triethoxyfluorosilane, triisopropoxyfluorosilane, and tributoxyfluorosilane;

a fluorine-containing alkoxysilane, such as $CF_3(CF_2)_3CH_2CH_2Si(OCH_3)_3$, $CF_3(CF_2)_5CH_2CH_2Si(OCH_3)_3$, $CF_3(CF_2)_7CH_2CH_2Si(OCH_3)_3$, $CF_3(CF_2)_9CH_2CH_2Si(OCH_3)_3$, $(CF_3)_2CF(CF_2)_4CH_2CH_2Si(OCH_3)_3$, $(CF_3)_2CF(CF_2)_6CH_2CH_2Si(OCH_3)_3$, $(CF_3)_2CF(CF_2)_8CH_2CH_2Si(OCH_3)_3$, $CF_3(C_6H_4)CH_2CH_2Si(OCH_3)_3$, $CF_3(CF_2)_3(C_6H_4)CH_2CH_2Si(OCH_3)_3$, $CF_3(CF_2)_5(C_6H_4)CH_2CH_2Si(OCH_3)_3$, $CF_3(CF_2)_7(C_6H_4)CH_2CH_2Si(OCH_3)_3$, $CF_3(CF_2)_3 CH_2CH_2SiCH_3(OCH_3)_2$, $CF_3(CF_2)_5CH_2CH_2SiCH_3(OCH_3)_2$, $CF_3(CF_2)_7CH_2CH_2SiCH_3(OCH_3)_2$, $CF_3(CF_2)_9 CH_2CH_2SiCH_3(OCH_3)_2$, $(CF_3)_2CF(CF_2)_4CH_2CH_2SiCH_3(OCH_3)_2$, $(CF_3)_2CF(CF_2)_6CH_2CH_2SiCH_3(OCH_3)_2$, $(CF_3)_2 CF(CF_2)_8CH_2CH_2SiCH_3(OCH_3)_2$, $CF_3(C_6H_4)CH_2CH_2SiCH_3(OCH_3)_2$, $CF_3(CF_2)_3(C_6H_4)CH_2CH_2SiCH_3(OCH_3)_2$, $CF_3(CF_2)_5(C_6H_4)CH_2CH_2SiCH_3(OCH_3)_2$, $CF_3(CF_2)_7(C_6H_4)CH_2CH_2SiCH_3(OCH_3)_2$, $CF_3(CF_2)_3 CH_2CH_2Si(OCH_2CH_3)_3$, $CF_3(CF_2)_5CH_2CH_2Si(OCH_2CH_3)_3$, $CF_3(CF_2)_7CH_2CH_2Si(OCH_2CH_3)_3$, and $CF_3(CF_2)_9CH_2CH_2Si(OCH_2CH_3)_3$;

a tertiary alkoxyalkylsilane, such as trimethoxymethylsilane, triethoxymethylsilane, trimethoxyethylsilane, triethoxyethylsilane, trimethoxypropylsilane, and triethoxypropylsilane;

a tertiary alkoxyarylsilane, such as trimethoxyphenylsilane, triethoxyphenylsilane, trimethoxychlorophenylsilane, and triethoxychlorophenylsilane; a tertiary alkoxyphenethylsilane, such as trimethoxyphenethylsilane, and triethoxyphenethylsilane;

a secondary alkoxyalkylsilane, such as dimethoxydimethylsilane, and diethoxydimethylsilane;

a bis-alkoxysilane, such as 1,2-bis(trimethoxysilyl)ethane, 1,2-bis(triethoxysilyl)ethane, 1,2-bis(dimethylmethoxysilyl)ethane, 1,2-bis(dimethylethoxysilyl)ethane, 1,6-bis(trimethoxysilyl)hexane, 1,6-bis(triethoxysilyl)hexane, 1,6-bis(dimethylmethoxysilyl)hexane, 1,6-bis(dimethylethoxysilyl)hexane, 1,4-bis(trimethoxysilyl)benzene, 1,3-bis(trimethoxysilyl)benzene, 1,4-bis(triethoxysilyl)benzene, and 1,3-bis(triethoxysilyl)benzene.

According to the present invention, one or more kinds selected from the above alkoxysilane compounds can be used.

The composition for preparing porous silica used in the present invention includes at least one type of (B) a hydrolysis product of a siloxane compound expressed by the above formula (1). According to the present invention, the siloxane compound expressed by the above formula (1) is preferably a cyclic siloxane compound, and more preferably a cyclic siloxane compound expressed by the following formula (2).

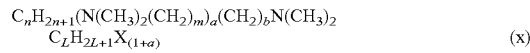

(2)

In the formula (2), each of $R^8$, $R^9$, $R^{10}$, $R^{11}$, $R^{12}$ and $R^{13}$ independently represents a hydrogen atom, a phenyl group, a $-C_aH_{2a+1}$ group, a $-(CH_2)_b(CF_2)_cCF_3$ group, or a $-C_dH_{2d-1}$ group, but $R^8$ and $R^9$ are not simultaneously hydrogen atoms, $R^{10}$ and $R^{11}$ are not simultaneously hydrogen atoms, and $R^{12}$ and $R^{13}$ are not simultaneously hydrogen atoms; a is an integer from 1 to 6, b is an integer from 0 to 4, c is an integer from 0 to 10, and d is an integer from 2 to 4;

L is an integer from 0 to 8, m is an integer from 0 to 8, n is an integer from 0 to 8, respectively, and $3 \leq L+m+n \leq 8$.

Specific examples of the cyclic siloxane compound include tris(3,3,3-trifluoropropyl)trimethylcyclotrisiloxane, triphenyltrimethylcyclotrisiloxane, octamethylcyclotetrasiloxane, 1,3,5,7-tetramethyl-1,3,5,7-tetraphenylcyclotetrasiloxane, 1,2,3,4,5,6-hexamethylcyclotrisiloxane, 1,3,5,7-tetraethyl-2,4,6,8-tetramethylcyclotetrasiloxane, 1,2,3-triethyl-2,4,6-triethylcyclotrisiloxane, 1,3,5,7-tetramethylcyclotetrasiloxane, 1,3,5,7-tetraethylcyclotetrasiloxane, 1,3,5,7-tetraphenylcyclotetrasiloxane, and pentamethylcyclopentasiloxane.

In the present invention, one or more kinds of the above cyclic siloxane compounds may be used. Among these, 1,3,5,7-tetramethylcyclotetrasiloxane is particularly preferred.

The composition for preparing porous silica used in the present invention includes at least one kind of (C) a surfactant.

Although there is no particular restriction on the surfactant, for example, a surfactant having a molecular weight of from 200 to 5,000 is preferable. In case the molecular weight is low, pores may not be formed sufficiently and the dielectric constant of porous silica may not be lowered; and in case the molecular weight is high, pores may be too large and the mechanical strength of the obtained porous silica may be lowered.

Preferable examples include the following surfactants.

(I) Compound having Long-chain Alkyl Group and Hydrophilic Group

The long-chain alkyl group is preferably an alkyl group having 8 to 24 carbon atoms, and more preferably an alkyl group having 12 to 18 carbon atoms. Examples of the hydrophilic group include a quaternary ammonium salt, an amino group, a nitroso group, a hydroxyl group, and a carboxyl group, and among them a quaternary ammonium salt or a hydroxyl group is preferable.

Specifically, an alkyl ammonium salt represented by the following formula (x) is preferable as the surfactant.

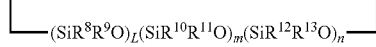

(x)

in the formula (x), a is an integer from 0 to 2, b is an integer from 0 to 4, n is an integer from 8 to 24, m is an integer from 0 to 12, L is an integer from 1 to 24, and X represents a hydroxide ion, a halide ion, $HSO_4^-$ or a monovalent organic anion.

When a, b, n, m and L are within the above range and X is the above ion, pores having an appropriate size can be formed, whereby a target compound can penetrate sufficiently in the pores during a gas phase reaction after the formation of the pores, and a desired polymerization reaction can be easily caused.

(II) Compound having Polyalkylene Oxide Structure

Examples of the polyalkylene oxide structure include a polyethylene oxide structure, a polypropylene oxide structure, a polytetramethylene oxide structure, and a polybutylene oxide structure.

Specific examples of the compound having a polyalkylene oxide structure include an ether compound, such as a polyoxyethylene polyoxypropylene block copolymer, a polyoxyethylene polyoxybutylene block copolymer; a polyoxyethylene polyoxypropylene alkyl ether, a polyoxyethylene alkyl ether, and a polyoxyethylene alkyl phenyl ether; and an ether ester compound, such as a polyoxyethylene glycerol fatty acid ester, a polyoxyethylene sorbitan fatty acid ester, a polyethylene sorbitol fatty acid ester, a sorbitan fatty acid ester, a propylene glycol fatty acid ester, and a sucrose fatty acid ester In the present invention, one or more kinds selected from the above surfactants can be used.

(D) Element having Electronegativity of 2.5 or Less

The composition according to the present invention contains at least one kind of (D) an element having an electronegativity of 2.5 or less (element (D)).

The element (D) used in the present invention has an effect of, for example, increasing the reactivity of the component (A) with the component (B), thereby enhancing the hydrophobicity and the mechanical strength of the finally obtained porous material.

Although the details of this effect have not been clarified, it is presumed that an active site for reaction is created as a result of removing an organic functional group from the component (B) by the element (D), whereby the component (B) is bonded to the component (A) more efficiently to form a dense inorganic polymer.

In order to achieve the above effect, it is believed to be important that the element (D) is an element having a reversible bonding state with respect to an element in the composition, such as Si, O or C. In order to create such a suitable interaction, an element having a Pauling's electronegativity different from that of Si, O or C is preferable. More specifically, an element having an electronegativity lower than 3.5, which is the electronegativity of O, is preferable, an element having an electronegativity lower than 2.5, which is the electronegativity of C, is more preferable, and an element having an electronegativity lower than 1.8, which is the electronegativity of Si, is further preferable.

In this connection, the metal element contained in the porous material is required to have a property of existing stable in the porous material, even if any kind of stress, especially an electric stress, is applied. Further, the metal element is required to have a property of not negatively affecting other elements than the porous material (porous film) used in an object to which the porous material is used, such as a semiconductor device. If the element contained is a normal metal element, it will cause a negative influence on the performance of a semiconductor, which is not desirable.

However, metal elements that do not cause a negative influence on a semiconductor, for example, amphoteric elements such as Al, Zn, Sn and Pb, have already been used in a semiconductor device and the use of such elements is not particularly limited.

The element (D) is preferably a large element having an ion radius of 1.6 Å or greater, which is hard to move even upon application of a certain degree of stress to a porous film.

Further, the element (D) is preferably a heavy element having an atomic weight of 130 or more, specifically, an element having an atomic number of 55 or higher classified to the sixth period of the periodic table.

Examples of the element (D) that satisfy the above conditions and are useable in the present invention include B, Al, P, Zn, Ga, Ge, As, Se, In, Sn, Sb, Te, Rb, Cs, Ba, La, Hf, Ta, W, Re, Os, Ir, Pt, Au, Hg, Tl, Pb, Bi, Po, At, and lanthanoids. Preferable is at least one element selected from the group consisting of Cs, Ba, lanthanoids, Hf, P, Pb, Bi, Po, Se, Te, As, Rb, Al and Sn. More preferable is at least one element selected from the group consisting of Cs, Ba, La, Hf, Ta, W and lanthanoids. Only one of such elements will suffice to exist in the composition according to the present invention.

The method for introducing the element (D) is not particularly limited, and either a method of introducing the element (D) as it is or a method of introducing a compound containing the element (D) is applicable.

There is no particular restriction on a compound containing the element (D), and examples thereof include a nitrate compound, an oxide compound, an organometallic compound, and a basic compound. Any other known compounds containing the element (D) are also applicable to the present invention.

The element (D) can be introduced via these compounds. In that case, the element (D) is preferably introduced as a mixture of the compound and an organic solvent such as an alcohol.

Further, the composition for preparing porous silica used in the present invention preferably contains (E) a hydrolysis product of a disilyl compound expressed by the following formula (3). By including this compound, the hydrophobicity and the strength of the porous silica are improved and the storage stability of the composition is improved.

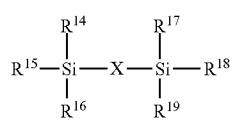

(3)

In the formula (3), each of $R^{14}$ to $R^{19}$ independently represents a hydrogen atom, a phenyl group, a $—C_aH_{2a+1}$ group, or a $—(CH_2)_b(CF_2)_cCF_3$ group; a is an integer from 1 to 6; b is an integer from 0 to 4; c is an integer from 0 to 10; and X represents an oxygen atom or a $>NR^{20}$ group, wherein $R^{20}$ represents a hydrogen atom or a $—C_eH_{2e+1}$ group, and e is an integer from 1 to 3.

Specific examples of the disilyl compound expressed by the above formula (3) include hexamethyldisilazane, hexaethyldisilazane, hexaphenyldisilazane, hexamethyldisiloxane, hexaethyldisiloxane, and hexaphenyldisiloxane. One or more kinds of the above disilyl compounds can be used in the present invention. Among the disilyl compounds, hexamethyldisiloxane is preferable.

Further, the disilyl compound expressed by the formula (3) may be used together with a further silyl compound. Examples of the silyl compound other than the disilyl compound expressed by the formula (3) include trimethylsilyl chloride, triethylsilyl chloride, trimethylsilyl dimethylamine, trimethylsilyl diethylamine, and trimethylsilyl diphenylamine.

The interlayer dielectric layer in the present invention can be formed by, for example, applying the composition for preparing porous silica onto a substrate to form a composition layer, subjecting the composition layer to a heat treatment, and exposing the heat-treated composition layer to ultraviolet rays.

There is no particular restriction on the substrate, and examples thereof include glass, quartz, a silicon wafer, stainless steel and plastic. The shape of the substrate is also not particularly limited, and the substrate may have a plate shape, a saucer shape, or the like.

The method for applying the composition onto the substrate is not particularly limited, and examples thereof include any ordinary methods such as a spin coating method, a casting method, and a dipping method. For example, in case of a spin coating method, a substrate is placed on a spinner and a coating solution is dropped on the substrate at a rotating speed of from 100 to 10,000 rpm. By performing the application, a precursor material (composition layer), which is a silica sol containing the component (A), the component (B), the surfactant (C) and the element (D), is obtained on the substrate.

The obtained composition layer is subjected to a heat treatment in the next step.

The heating temperature at the heat treatment is preferably from 80 to 400° C.

The term "heat treatment" mentioned herein refers to both a heat treatment carried out at below 200° C. in order to remove a volatile component such as an organic solvent or water (low-temperature heat treatment) and a heat treatment carried out at 200° C. or higher in order to remove a surfactant that has been added to form pores by way of thermal degradation (high-temperature heat treatment).

Since an organic solvent or water is adsorbed to the precursor material immediately after the application, it is preferable to remove such volatile components by carrying out a low-temperature heat treatment.

The temperature at the low-temperature heat treatment is from 80 to 200° C., and preferably from 100 to 150° C. When the temperature is within this range, volatile components such as an organic solvent or water can be removed without causing problems such as bulging or delaminating of the composition layer due to rapid heating. One minute of carrying out the low-temperature heat treatment will be enough, and it is preferably from 1 to 60 minutes since the curing rate may become extremely low after the lapse of a certain time for the treatment.

There is no particular restriction on a method for heating a silica sol, and any known methods for heating a sol can be adopted.

Next, a high-temperature heat treatment is conducted.

In the high-temperature heat treatment, the higher the temperature is, the easier it is to cause degradation of a surfactant. However, considering a problem that may occur in the semiconductor processing, the temperature is preferably 400° C. or less, and more preferably 350° C. or less. Considering the time for processing, the temperature of 200° C. or higher, or 300° C. or higher is preferable. The high-temperature heat treatment may be conducted by a known method without particular restriction on a heating atmosphere, such as nitrogen, oxygen, hydrogen, and air. However, when the treatment is conducted in semiconductor processing, a non-oxygen atmosphere is preferred lest the interconnection resistance increase due to oxidation of Cu interconnections. The term "non-oxidative atmosphere" refers to an atmosphere in which the oxygen concentration during baking (high-temperature heat treatment) is 50 ppm or less.

From the viewpoints as above, the heat treatment in the present invention is particularly preferably conducted by performing a heat treatment at from 80° C. to 200° C., and then performing a heat treatment at from 300° C. to 400° C.

According to the present invention, it is important to expose the heat-treated composition layer to ultraviolet rays in order to form a porous material having a low dielectric constant and a high mechanical strength, and examples of favorable conditions for the ultraviolet treatment include the following conditions.

For example, the wavelength of ultraviolet rays is preferably from 10 nm to 400 nm, and more preferably from 150 nm to 250 nm. Ultraviolet rays of a wavelength within this range exert energy that is sufficient to dissociate a functional group from a silicon atom in the component (B). The intensity of ultraviolet rays is preferably from 1 $mW/cm^2$ to 50 $mW/cm^2$, and more preferably from 5 $mW/cm^2$ to 20 $mW/cm^2$, since it influences the time for dissociation of a functional group, or the like, and ultraviolet rays with a higher intensity make the time shorter. The temperature for ultraviolet irradiation is preferably from 10 to 400° C., further preferably from 150 to 350° C., and particularly preferably from 200 to 350° C. The temperature is preferably high since the reaction rate is improved in terms of the dissociation of a functional group from a silicon atom by ultraviolet irradiation, and the reaction between the dissociation site of the functional group and a silanol. Although there is no particular restriction on the time for ultraviolet irradiation, it is preferably within 20 minutes, more preferably within 10 minutes, in view of an economic aspect. The pressure during the ultraviolet irradiation is preferably in a range of from 0.01 kPa to 101.3 kPa. The ultraviolet irradiation is preferably carried out in a non-oxidative atmosphere. If oxygen exists during the ultraviolet irradiation, ozone is generated by the ultraviolet rays, whereby hydrophobic groups in porous silica are oxidized and the amount thereof is reduced. Consequently, it is preferred to control the oxygen concentration to be 10 ppm or less.

There is no particular restriction on a method for contacting a composition for sealing a semiconductor according to the present invention with the interlayer dielectric layer, and an ordinary method can be applied. For example, a dipping method (see e.g. U.S. Pat. No. 5,208,111), a spraying method (see e.g. Schlenoff, et al., Langmuir, 16(26), 9968, 2000, or Izquierdo, et al., Langmuir, 21(16), 7558, 2005), and a spin coating method (see e.g. Lee, et al., Langmuir, 19(18), 7592, 2003, or J. Polymer Science, part B, polymer physics, 42, 3654, 2004) can be used.

According to a process for producing a semiconductor device according to the present invention, a resin layer formed from the resin can be formed as a thin film on the interlayer dielectric layer by using the composition for sealing a semiconductor containing the resin. The thickness of the resin layer is not particularly limited, but is from 0.3 nm to 5 nm, for example, and preferably from 0.5 nm to 2 nm.

According to a process for producing a semiconductor device according to the present invention, the composition for sealing a semiconductor preferably contains a resin having a cationic functional group equivalent weight of from 43 to 430, and has a pH not lower than the isoelectric point of the interlayer dielectric layer, the pH being in a range in which the cationic functional group is in a state of a cation. The pH of the composition is more preferably from 2 to 11, and yet more preferably from 7 to 11. By contacting this composition for sealing a semiconductor with the interlayer dielectric layer, the resin is adsorbed to the interlayer dielectric layer more efficiently.

The isoelectric point of the interlayer dielectric layer, and the pH range in which the cationic functional group is in a cation state, are as described above.

The concentration of the resin contained in the composition for sealing a semiconductor, which is used in the step for applying a sealing composition according to the present invention, is preferably less than the critical micelle concentration of the resin. In that case, the resin can be applied onto an interlayer dielectric layer as a thin film (for example, 5 nm or less, preferably 2 nm or less) and an increase in the dielectric constant can be suppressed.

It is preferred that the process for producing a semiconductor device according to the present invention further includes a step for forming a recessed groove having a width of from 10 nm to 32 nm in the interlayer dielectric layer, and the step for applying a sealing composition is a step for contacting the composition for sealing a semiconductor with the interlayer dielectric layer at least at side surfaces of the recessed groove.

According to this embodiment, pores existing on the interlayer dielectric layer that constitutes the side surfaces of the recessed groove formed in the interlayer dielectric layer can be effectively covered, and when an interconnection material is embedded in the recessed groove, diffusion of a metal component in the interconnection material into the interlayer dielectric layer can be suppressed.

The term "side surfaces" of the recessed groove refers to surfaces formed substantially perpendicular to a plane that is parallel to the substrate.

The step for forming a recessed groove having a width of from 10 nm to 32 nm in the interlayer dielectric layer may be conducted according to the conditions for a process commonly conducted for producing a semiconductor device. For example, a groove having a desired pattern can be formed by forming a hard mask and a photoresist on an interlayer dielectric layer, and then etching the interlayer dielectric layer according to the pattern of the photoresist.

Further, as a method for contacting the composition for sealing a semiconductor with an interlayer dielectric layer at the side surfaces of the recessed groove, a dipping method, a spraying method and a spin coating method, which are described above, may be used.

In the present invention, a washing step or a drying step may be further provided after contacting the composition for sealing a semiconductor with the interlayer dielectric layer, as necessary.

The process for producing a semiconductor device according to the present invention may include a step that is ordinarily conducted, such as a step for forming an interconnection, after the step for applying a sealing composition, as necessary.

The step for forming an interconnection may be conducted under known process conditions. For example, after forming copper interconnections a metallic CVD method, a sputtering method or an electrolytic plating method, the film is planarized by CMP. Subsequently, a capping film is formed on the surface of the film. Further, as necessary, a hard mask is formed thereon, and a multilayer structure can be formed by repeating the above process. A semiconductor device according to the present invention is thus obtained.

Further, in the process for producing a semiconductor device according to the present invention, a step for forming a barrier film (copper barrier film) may be further provided after the step for applying a sealing composition and prior to the step for forming an interconnection. By forming a barrier film, diffusion of a metal component to the interlayer dielectric layer can be suppressed more effectively.

The step for forming a barrier film can be conducted under ordinary process conditions. For example, a barrier film of a titanium compound, such as titanium nitride, or a tantalum compound, such as tantalum nitride, can be formed by a vapor deposition (CVD) method after the step for applying a sealing composition. In the present invention, it is preferable to form a barrier film from a tantalum compound.

(Semiconductor Device)

The semiconductor device according to the present invention has a structure in which a porous interlayer dielectric layer, a resin layer and a copper layer are positioned in this order, and a further layer as necessary. The resin layer has a thickness of from 0.3 nm to 5 nm and contains a resin having two or more cationic functional groups and a weight-average molecular weight of from 2,000 to 100,000. By providing a resin layer containing a resin as specified above between an interlayer dielectric layer and an interconnection material, occurrence of leak current can be suppressed even when the circuit has a minute structure of 32 nm or less, whereby favorable performances can be achieved.

In the present invention, it is preferable to further include a copper barrier layer (preferably a layer composed of a tantalum compound) between the resin layer and the interconnection material containing copper.

The semiconductor device according to the present invention can be produced by an ordinary method of producing a semiconductor device.

The content of the disclosure by Japanese Patent Application No. 2009-130251 is herein entirely incorporated by reference.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the present invention will be described more specifically with reference to the Examples, but the present invention is not limited to the Examples. The components used in the Examples and the Comparative Examples are as follows.

(A) Alkoxysilane Compound

Tetraethoxysilane (electronics grade, manufactured by Yamanaka Semiconductor Co., Ltd., $Si(OC_2H_5)_4$)

(B) Siloxane Compound Expressed by Formula (1)

1,3,5,7-tetramethylcyclotetrasiloxane (cyclic siloxane compound, electronics grade, manufactured by Tri Chemical Laboratories Inc., $(CH_3Si(H)O)_4$)

(C) Surfactant

Polyoxyethylene(20) stearyl ether (trade name: Brij78, manufactured by Sigma-Aldrich, Inc., $C_{18}H_{37}(CH_2CH_2O)_2OH$), dissolved in ethanol for electronics and demetallized with an ion exchange resin to 10 ppb or less.

(D) Element

Cesium (Cs) in a cesium nitrate aqueous solution (manufactured by Wako Pure Chemical Industries, Ltd., special grade, $CsNO_3$).

Disilyl Compound

Hexamethyldisiloxane (manufactured by Sigma-Aldrich, Inc., $((CH_3)_3Si)_2O$) purified by distillation).

Water

Pure water demetallized to have a resistance value of 18 MΩ or higher.

Organic Solvent

Ethanol (electronics grade, manufactured by Wako Pure Chemical Industries, Ltd., $C_2H_5OH$)

1-propyl alcohol (electronics grade, manufactured by Kanto Chemical Co., Ltd., $CH_3CH_2CH_2OH$)

2-butyl alcohol (electronics grade, manufactured by Kanto Chemical Co., Ltd., $CH_3(C_2H_5)CHOH$)

Silylation Agent 1,3,5,7-tetramethylcyclotetrasiloxane (electronics grade, manufactured by Tri Chemical Laboratories Inc., $(CH_3Si(H)O)_4$)

(Preparation of Precursor Solution)

After mixing and stirring 90.9 g of tetraethoxysilane and 70.9 g of ethanol at room temperature, 80 mL of 1 mol/L nitric acid were added and stirred at 50° C. for 1 hour. Next, a solution dissolving 20.9 g of polyoxyethylene(20) stearyl ether in 280 g of ethanol was dropped and mixed. After mixing, the mixture was stirred at 30° C. for 4 hours. The obtained solution was concentrated to 90 g at 25° C. under a reduced pressure of 30 hPa. After the concentration, a solution of 1-propyl alcohol and 2-butyl alcohol mixed at a ratio of 1:1 by volume was added, thereby obtaining 1,885 g of a precursor solution.

(Preparation of Composition for Preparing Porous Silica)

A cesium nitrate aqueous solution was added to 300 g of the precursor solution until the Cs concentration was 15 ppm.

Then, 1.7 g of 1,3,5,7-tetramethylcyclotetrasiloxane were added and stirred at 25° C. for 1 hour, thereby obtaining a composition for preparing porous silica. The amount of 1,3, 5,7-tetramethylcyclotetrasiloxane added in the above process was 10% by mol with respect to tetraethoxysilane.

(Formation of Interlayer Dielectric Layer)

1.0 mL of the composition for preparing porous silica were dropped onto a surface of a silicon wafer, and the wafer was rotated at 2000 rpm for 60 seconds to coat the surface of the silicon wafer. The wafer was then subjected to a heat treatment in a nitrogen atmosphere at 150° C. for 1 minute, and subsequently at 350° C. for 10 minutes. Thereafter, the wafer was heated to 350° C. in a chamber equipped with a 172 nm excimer lamp, and exposed to ultraviolet rays at a power of 14 mW/cm$^2$ under a pressure of 1 Pa for 10 minutes, thereby obtaining an interlayer dielectric layer (porous silica film).

The density of the obtained interlayer dielectric layer was 0.887 g/cm$^3$.

The relative dielectric constant k and the elastic modulus E of the obtained interlayer dielectric layer were 2.0 and 6.60 GPa, respectively.

The density was measured according to an ordinary method using an XRD apparatus (TPR-In-Plane, manufactured by Rigaku Corporation) with an X-ray power supply unit of 50 kV, 300 mA and a wavelength of 1.5418 Å, in a scanning range of from 0 to 1.5°.

The relative dielectric constant was measured according to an ordinary method using a mercury probe apparatus (SSM5130) under an atmosphere with a relative humidity of 30% at 25° C., and at a frequency of 1 MHz.

The elastic modulus was measured according to an ordinary method using a nanoindentator (Triboscope, manufactured by Hysitron Corp.) with an indentation depth of not more than 1/10-fold the film thickness.

Example 1

A polyethyleneimine aqueous solution 1 (PEI, manufactured by BASF SE, weight-average molecular weight: 25,000, 250 mg/100 mL, pH: 10.52, cationic functional group equivalent weight: 309) was made to contact the interlayer dielectric layer obtained in the above process (hereinafter, also referred as "low-k") using a commercially available spraying bottle (AIR-BOY, manufactured by Carl Roth GmbH) by a spraying method (solution contact time: 20 sec, spraying distance: 10 cm). Next, water was made to contact the interlayer dielectric layer using a similar spraying bottle by a spraying method (contact time with ultrapure water: 10 sec, spraying distance: 10 cm). After drying by air blowing, a resin layer was formed on the interlayer dielectric layer. After being stored in a constant-temperature and constant-humidity environment of 23° C. and 55% for 15 hours or longer, the sample (low-k/PEI) was subjected to the following evaluation.

The water used in the above process was ultrapure water (Milli-Q water, manufactured by Millipore, resistance: 18 MΩ·cm (25° C.) or less).

(Measurement of Contact Angle of Water)

The contact angle of water with respect to the obtained sample (hereinafter, also referred to as "low-k/PEI") was measured using a FACE solid surface energy analyzer (Model CA-XE) by an ordinary method in an environment of 23° C. and 55% RH. The result was 13.2°.

Further, the difference between the contact angle measured before the formation of the resin layer and the contact angle measured after the formation of the resin layer was calculated and evaluated according to the following rating scale. The result was "A".

Rating scale:
A: The difference in the contact angle was greater than 30°.
B: The difference in the contact angle was from 20° to 30°.
C: The difference in the contact angle was less than 20°.

(Composition and Shape of Resin Layer)

The elementary composition of the formed resin layer of the obtained sample (low-k/PEI) was measured using an XPS apparatus ESCALAB 220iXL (manufactured by VG Scienta) under the conditions of an X-ray source: AlKα, analysis range: φ1 mm. As a result, the composition that had increased compared with the interlayer dielectric layer (low-k) obtained above was C/N=2.34. From this result, it was confirmed that a layer of polyethyleneimine was formed.

The morphology of the resin layer surface was observed with an atomic force microscope. As a result, the RMS was 0.369 nm (0.403 nm for the interlayer dielectric layer alone), indicating that a layer with a uniform thickness was formed.

Formation of Metal Film

A metallic copper film was formed by sputtering on the resin layer of the obtained sample (low-k/PEI), thereby preparing sample 1 (hereinafter, also referred to as "low-k/PEI/ Cu).

The obtained sample 1 (low-k/PEI/Cu) was visually observed, and it was confirmed that a metal film having a metallic copper color was formed on the resin layer.

The sputtering was conducted by an apparatus HSM-521 (manufactured by Shimadzu Corporation) under the conditions of a current set at 0.4 A, a voltage set at 440 V, an Ar atmosphere, and a sputtering time of 2 minutes and 10 seconds.

(Measurement of Film Thickness of Metal Film)

The thickness of the metal film of sample 1 (low-k/PEI/Cu) obtained in the above process was measured with a surface profiler DEKTAK3 (version 3.22b FP/J, manufactured by Veeco Metrology Group). The result was from 50 nm to 100 nm.

(Evaluation of Diffusion of Metal Component)

A section sample of sample 1 (low-k/PEI/Cu) obtained in the above process was prepared with an FIB processing apparatus SMI2050 (manufactured by Seiko Instruments Inc.) The cross-section of the sample, having a copper film formed on a resin layer, was observed with a transmission electron microscope JEM-2200FS (manufactured by JEOL Ltd., acceleration voltage: 220kV) to measure the diffusion depth of a metal component. As a result, the diffusion depth of the metal component was 0 nm.

(Thickness of Obtained Resin Layer)

The cross-section of sample 1 (low-k/PEI/Cu) obtained in the above process was observed to carry out element mapping. From the distribution pattern of nitrogen atoms originated from polyethyleneimine, the thickness of the formed resin layer was estimated to be 5 nm or less.

(Evaluation of Adherence 1)

A sample (Si/PEI) was prepared by forming a resin layer on a silicon wafer in a similar manner to the above. Except that this sample was used, a sample (Si/PEI/Cu) was prepared by forming a metallic copper film on the resin layer in a similar manner to the above. The adherence of the metallic copper film with respect to the obtained sample (Si/PEI/Cu) was evaluated in accordance with the following method. The result was "A".

Evaluation Method of Adherence

A test sample was subjected to a heat treatment in a nitrogen/hydrogen atmosphere at 350° C. for 30 min, and then stored in a constant-temperature and constant-humidity environment of 23° C. and 55% for 15 hours or longer. Thereafter, a cross-cut adhesion test according to JIS 1(5600 was conducted using a cellophane tape (CT405AP-18, manufactured by Nichiban Co., Ltd., width: 18 mm) and the result was evaluated according to the following rating scale.

Rating Scale

A: Cut edges were totally smooth, and there was no delamination of grid squares.

B: There was a slight degree of delamination at intersections. The affected cross-cut portions were 5% or less.

C: There was delamination along the cut edges or at intersections. The affected cross-cut portions were beyond 5% to 15% or less.

D: There was partial or significant delamination along the cut edges, and there was partial and total delamination of grid squares. The affected cross-cut portions were beyond 15% to 35% or less.

E: There was partial or significant delamination along the cut edges, and partial and total delamination of several grid squares. The affected cross-cut portions were beyond 15% to 35% or less.

F: There was partial or significant delamination along the cut edges, and partial and total delamination of many grid squares. The affected cross-cut portions were beyond 35%.

(Evaluation of Adherence 2)

A sample (low-k/PEI) was prepared by forming a resin layer on an interlayer dielectric layer (low-k) in a similar manner to the above. Except that this sample was used, a sample (low-k/PEI/Cu) was prepared by forming a metallic copper film on the resin layer in a similar manner to the above. The adherence of the metallic copper film with respect to the obtained sample (low-k/PEI/Cu) was evaluated in accordance with the following method. The result was "B".

Evaluation Method of Adherence

A test sample was stored in a constant-temperature and constant-humidity environment of 23° C. and 55% for 15 hours or longer. Thereafter, a cross-cut adhesion test according to JIS K5600 was conducted using a cellophane tape (CT405AP-18, manufactured by Nichiban Co., Ltd., width 18 mm). The morphology of exposed surfaces was observed by an optical microscope (digital microscope KH-7700, manufactured by Hirox Co., Ltd.), a field-emission scanning electron microscope (JSM-6701F, manufactured by JEOL), and a surface profiler (DEKTAK3, version 3.22b FP/J, manufactured by Veeco Metrology Group). Further, each of the exposed surfaces was subjected to element analysis for identification by an energy dispersive X-ray analyzer (EX-37001, manufactured by JEOL). The adherence was evaluated according to the following rating scale.

Rating Scale

A: The remaining area of the low-k material is less than 10% (Si exposed area is 90% or more).

B: The remaining area of the low-k material is not less than 10% but less than 30% (Si exposed area is 70% or more but less than 90%).

C: The remaining area of the low-k material is not less than 30% but less than 90% (Si exposed area is 10% or more but less than 70%).

D: The remaining area of the low-k material is not less than 90% (Si exposed area is less than 10%).

(Micelle Formability)

The volume average particle diameter of the polyethyleneimine aqueous solution 1 in Example 1 was measured by a dynamic light scattering method using ELSZ-2 (manufactured by Otsuka Electronics Co., Ltd.). The result was below the detection limit (<10 nm).

The measurement conditions were: number of accumulation: 70, number of repetition: 1, and histogram analysis and cumulant analysis were utilized as analysis conditions.

Comparative Example 1

The sample C1 was prepared in a similar manner to Example 1, except that ultrapure water was used instead of the polyethyleneimine aqueous solution Used in Example 1.

The diffusion of a metal component of sample C1 was evaluated in a similar manner to Example 1. As a result, the diffusion depth of a metal component was 20 nm, which was problematic in terms of practical use.

Further, the adherence of the metal film evaluated in a similar manner to the evaluation of adherence 1 in Example 1 was "A". The adherence evaluated in a similar manner to the evaluation of adherence 2 in Example 1 was "A" since a resin layer was not formed on the interlayer dielectric layer. The evaluated difference in contact angle with respect to water was "C".

The volume average particle diameter measured by a dynamic light scattering method was below the detection limit.

Comparative Example 2

The sample C2 was prepared by forming a resin layer in a similar manner to Example 1, except that a polyethylene glycol aqueous solution (PEG, manufactured by Wako Pure Chemical Industries, Ltd., 100 mg/100 mL, weight-average molecular weight: 10,000) was used instead of the polyethyleneimine aqueous solution used in Example 1.

The thickness of the formed resin film was estimated in a similar manner to Example 1, and the result was 5 nm or less.

Further, the adherence was evaluated in a similar manner to the evaluation of adherence 2. The result was "D", indicating that the adherence was poor. The evaluation result of the difference in contact angle with respect to water was "B".

The volume average particle diameter measured by a dynamic light scattering method was below the detection limit (<10 nm).

Comparative Example 3

A polymer having a structure in which a polyethylene glycol chain was bonded to an end of an ethylene polymer (number average molecular weight: 6,115, hereinafter referred to as "AB3") was prepared in accordance with the Synthesis Example A6 described in paragraph of WO 2009/087961. The polymer was dissolved in ultrapure water to obtain an AB3 aqueous solution (100 mg/mL, pH 7.64).

A sample C3 was prepared by forming a resin layer on the interlayer dielectric layer (low-k) in a similar manner to Example 1, except that the AB3 aqueous solution obtained in the above process was used. The evaluation result of the difference in contact angle with respect to water was "B".

The morphology of the resin layer surface was observed with an atomic force microscope. As a result, the RMS was about 50 nm, indicating that a thin uniform layer could not be formed.

The volume average particle diameter measured by a dynamic light scattering method according to histogram analysis was 99.5 nm.

The above results demonstrate that, by forming a resin layer by contacting a composition for sealing a semiconductor according to the present invention with a porous interlayer dielectric layer, a thin resin layer can be formed, diffusion of a metal component to the porous interlayer dielectric layer can be suppressed, and excellent adherence with respect to an interconnection material can be achieved.

The invention claimed is:

1. A composition for sealing a semiconductor, the composition comprising:
   a resin having two or more cationic functional groups and a weight-average molecular weight of from 2,000 to 100,000; and
   sodium and potassium each in an amount based on element content of not more than 10 ppb by weight, and
   the composition having a volume average particle diameter, measured by a dynamic light scattering method, of not more than 10 nm.

2. The composition for sealing a semiconductor according to claim 1, wherein the resin has a cationic functional group equivalent weight of 43 to 430.

3. The composition for sealing a semiconductor according to claim 1, wherein the cationic functional groups are at least one of a primary amino group or a secondary amino group.

4. The composition for sealing a semiconductor according to claim 1, wherein the resin is polyethyleneimine or a derivative of polyethyleneimine.

5. A process for producing a semiconductor device, the process comprising a step for applying a sealing composition in which the composition for sealing a semiconductor according to claim 1 is applied to an interlayer dielectric layer formed on a substrate.

6. The process for producing a semiconductor device according to claim 5, wherein the interlayer dielectric layer comprises porous silica and has, on a surface of the interlayer dielectric layer, residual silanol derived from the porous silica.

7. The process for producing a semiconductor device according to claim 5, further comprising a step for forming a recessed groove, having a width of from 10 nm to 32 nm, in the interlayer dielectric layer, and, in the step for applying a sealing composition, the composition for sealing a semiconductor being made to contact at least the interlayer dielectric layer at side surfaces of the recessed groove.

8. A semiconductor device having a structure comprising a porous interlayer dielectric layer, a resin layer and a layer comprising copper, in this order,
   the resin layer having a thickness of from 0.3 nm to 5 nm and comprising a resin having two or more cationic functional groups and a weight-average molecular weight of from 2,000 to 100,000.

9. The semiconductor device according to claim 8, further comprising a copper barrier layer disposed between the resin layer and the layer comprising copper.

* * * * *